United States Patent
Kim et al.

(10) Patent No.: US 10,811,116 B2
(45) Date of Patent: Oct. 20, 2020

(54) SEMICONDUCTOR SYSTEMS

(71) Applicant: SK hynix Inc., Icheon-si Gyeonggi-do (KR)

(72) Inventors: Woongrae Kim, Icheon-si (KR); Sangkwon Lee, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/370,327

(22) Filed: Mar. 29, 2019

(65) Prior Publication Data

US 2019/0228833 A1 Jul. 25, 2019

Related U.S. Application Data

(62) Division of application No. 15/819,411, filed on Nov. 21, 2017, now Pat. No. 10,290,361.

(30) Foreign Application Priority Data

Jun. 8, 2017 (KR) .......................... 10-2017-0071601

(51) Int. Cl.
*G11C 29/44* (2006.01)
*G11C 29/42* (2006.01)
*G11C 29/00* (2006.01)
*G11C 29/04* (2006.01)

(52) U.S. Cl.
CPC .......... *G11C 29/4401* (2013.01); *G11C 29/42* (2013.01); *G11C 29/44* (2013.01); *G11C 29/72* (2013.01); *G11C 29/76* (2013.01); *G11C 2029/0409* (2013.01); *G11C 2029/0411* (2013.01); *G11C 2029/4402* (2013.01)

(58) Field of Classification Search
CPC ..... G11C 29/4401; G11C 29/72; G11C 29/76; G11C 29/42

See application file for complete search history.

(56) References Cited

U.S. PATENT DOCUMENTS

| 4,493,075 A * | 1/1985 | Anderson | G11C 29/76 365/200 |
| 5,841,711 A * | 11/1998 | Watanabe | G11C 29/789 365/200 |
| 6,574,757 B1 * | 6/2003 | Park | G11C 29/44 714/710 |
| 7,823,046 B2 * | 10/2010 | Hirabayashi | G06F 11/1008 714/704 |

(Continued)

FOREIGN PATENT DOCUMENTS

KR 1020140125981 A 10/2014

OTHER PUBLICATIONS

Stephen B. Wicker, Error Control Systems for Digital Communication in a Storage, Prentice-Hall, 1995, pp. 98-121 (Year: 1995).*

*Primary Examiner* — Joseph D Torres
(74) *Attorney, Agent, or Firm* — William Park & Associates Ltd.

(57) ABSTRACT

A semiconductor system may be configured to classify failure groups of data including erroneous bits and may replace a memory area in which the failure groups are stored with a redundancy area. The replacement of the memory area in which the failure groups are stored, with the redundancy area, may be performed according to priorities of the failure groups.

12 Claims, 12 Drawing Sheets

(56) References Cited

U.S. PATENT DOCUMENTS

| | | |
|---|---|---|
| 10,204,700 B1* | 2/2019 | Oh .................. G11C 29/52 |
| 2003/0179616 A1 | 9/2003 | Wohlfahrt et al. |
| 2004/0120173 A1* | 6/2004 | Regev ............... G06F 11/1064 |
| | | 711/105 |
| 2005/0281076 A1* | 12/2005 | Poechmueller ...... G11C 29/787 |
| | | 365/154 |
| 2013/0117617 A1* | 5/2013 | Oh .................. G11C 29/18 |
| | | 714/718 |
| 2015/0255176 A1* | 9/2015 | Hyder .............. G11C 29/4401 |
| | | 714/723 |
| 2016/0042809 A1* | 2/2016 | Kim ................. G11C 29/52 |
| | | 714/719 |
| 2016/0314041 A1* | 10/2016 | Cha ................. G11C 29/42 |
| 2018/0331692 A1* | 11/2018 | Gulati .............. G06F 11/2215 |

* cited by examiner

SEMICONDUCTOR SYSTEMS

CROSS-REFERENCE TO RELATED APPLICATIONS

The present application is a divisional application of U.S. patent application Ser. No. 15/819,411, filed on Nov. 21, 2017, and claims priority under 35 U.S.C 119(a) to Korean Application No. 10-2017-0071601, filed on Jun. 8, 2017, which is incorporated herein by reference in its entirety.

BACKGROUND

1. Technical Field

Embodiments of the present disclosure may generally relate to semiconductor systems, and more particularly to semiconductor systems including semiconductor devices configured for correcting data errors.

2. Related Art

With regards to the fabrication of semiconductor devices, attempts to increase integration density in the semiconductor devices have typically resulted in the increase of failed memory cells. This may lead to lowering the fabrication yield of the semiconductor devices. Even though each semiconductor device has, for example, only a single defective memory cell, the semiconductor device still cannot be supplied to customers due to the single defective memory cell.

A lot of effort has gone into improving the fabrication yield of highly integrated semiconductor devices. For example, various techniques for repairing addresses of failed memory cells with redundancy memory cells have been proposed to improve the fabrication yield of the highly integrated semiconductor devices.

Whenever data is transmitted in semiconductor devices, error codes which are capable of detecting the occurrence of errors may be generated and transmitted with the data to guarantee the reliability of data transmission. The error codes may include an error detection code (EDC) which is capable of detecting errors and an error correction code (ECC) which is capable of correcting the errors by itself.

SUMMARY

According to an embodiment, a semiconductor system may be provided. The semiconductor system may include a first semiconductor device and a second semiconductor device. The first semiconductor device may be configured to output a test command, a test address, test input data, and an error correction control signal. The first semiconductor device may be configured to classify failure groups of test output data and may be configured to generate a failure row address and a failure column address that may include position information on the failure groups. The second semiconductor device may be configured to perform an error correction operation of internal data selected by the test address to output the corrected internal data as the test output data based on a test enablement signal and the error correction control signal. The second semiconductor device may be configured to replace a memory area in which the failure groups of the test output data are stored with a redundancy area according to a row address and a column address generated from the failure row address and the failure column address.

According to an embodiment, a semiconductor system may be provided. The semiconductor system may include a first semiconductor device and a second semiconductor device. The first semiconductor device may be configured to output a test command, a test address, test input data, and an error correction control signal. The first semiconductor device may be configured to set priorities of failure groups of test output data. The second semiconductor device may be configured to perform an error correction operation of internal data selected by the test address to output the corrected internal data as the test output data based on a test enablement signal and the error correction control signal. The second semiconductor device may be configured to replace a memory area in which the failure groups of the test output data are stored with a redundancy area according to the priorities of the failure groups.

According to an embodiment, a semiconductor system may be provided. The semiconductor system may include a first semiconductor device that may be configured to classify failure groups of data including erroneous bits and replace a memory area in which the failure groups are stored with a redundancy area according to priorities of the failed groups.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
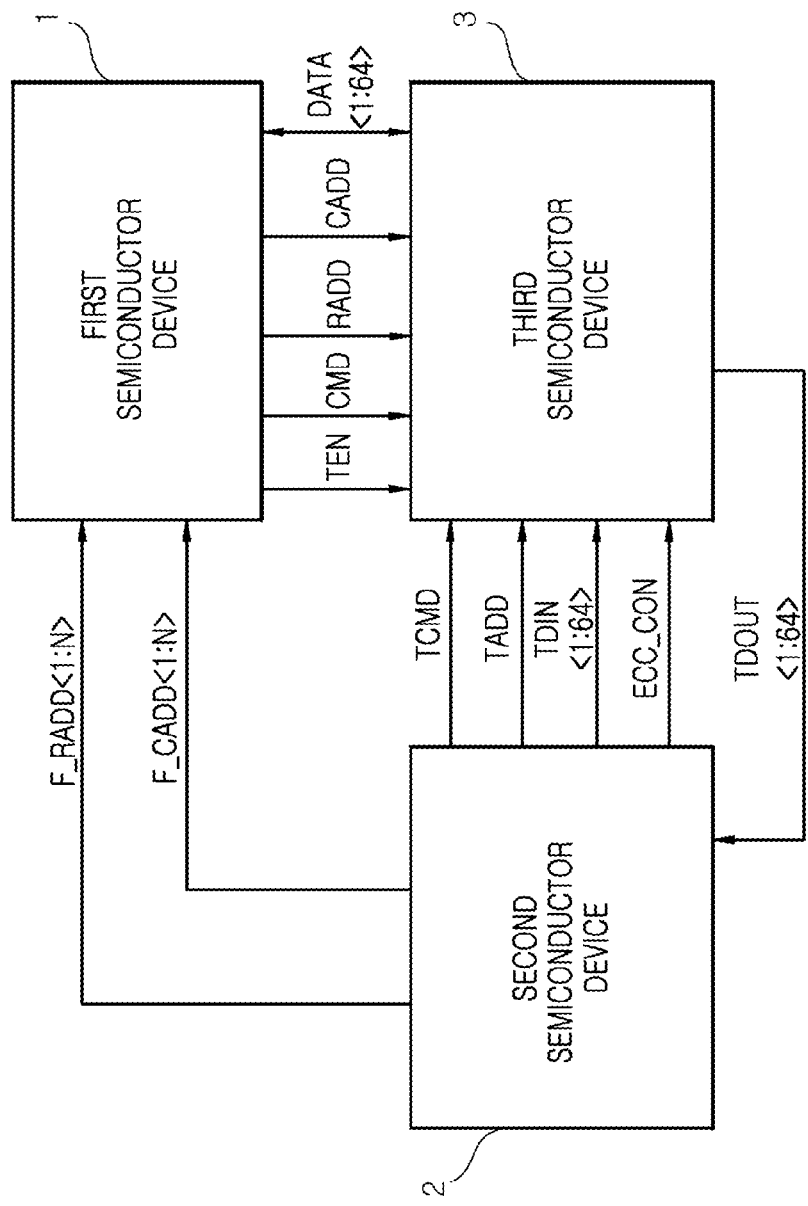
FIG. 1 is a block diagram illustrating a configuration of a semiconductor system according to an embodiment of the present disclosure.

Referring to FIG. 1, a semiconductor system according to an embodiment may include a first semiconductor device 1, a second semiconductor device 2, and a third semiconductor device 3.

The first semiconductor device 1 may output a test enablement signal TEN, a command CMD, a row address RADD, and a column address CADD. The first semiconductor device 1 may receive or output data DATA<1:64>. The first semiconductor device 1 may change a combination of the row address RADD corresponding to a failure row address F_RADD<1:N> and a combination of the column address CADD corresponding to a failure column address F_CADD<1:N> and may output the row address RADD and the column address CADD with the combination changes. Although the command CMD is illustrated with a single signal line, the command CMD may be set to include a plurality of bits and may be transmitted through signal lines that transmit at least one group of addresses, commands, and data. Although each of the row address RADD and the column address CADD is illustrated with a single signal line, each of the row address RADD and the column address CADD may be set to include a plurality of bits and may be transmitted through signal lines that transmit at least one group of addresses, commands, and data. The data DATA <1:64> may be transmitted through signal lines that transmit at least one group of addresses, commands and data. The number of bits of the data DATA <1:64> may be set to be different according to the embodiments. The test enablement signal TEN may be enabled to perform a test for classifying failure groups of test output data TDOUT<1:64>.

The second semiconductor device 2 may output a test command TCMD, a test address TADD, a test input data TDIN<1:64>, and an error correction control signal ECC_CON. The test address TADD may be set to include a plurality of bits which are sequentially counted. The second semiconductor device 2 may classify the failure groups of the test output data TDOUT<1:64>. The second semiconductor device 2 may generate the failure row address F_RADD<1:N> and the failure column address F_CADD<1:N> that include position information on the failure groups of the test output data TDOUT<1:64>. The error correction control signal ECC_CON may be enabled to perform an error correction operation for correcting errors of internal data (ID<1:64> of FIG. 8).

The third semiconductor device 3 may perform the error correction operation of the internal data (ID<1:64> of FIG. 8) selected according to the test address TADD to output the corrected internal data as the test output data TDOUT<1:64>, in response to the test enablement signal TEN and the error correction control signal ECC_CON. The third semiconductor device 3 may replace an area in which a failure group of the test output data TDOUT<1:64> is stored according to the row address RADD and the column address CADD generated from the failure row address F_RADD<1:N> and the failure column address F_CADD<1:N> with a redundancy area (a row redundancy area 352 and a column redundancy area 353 of FIG. 10). The third semiconductor device 3 may receive or output the data DATA<1:64> according to the row address RADD and the column address CADD in response to the command CMD and the error correction control signal ECC_CON.

Figure 2:
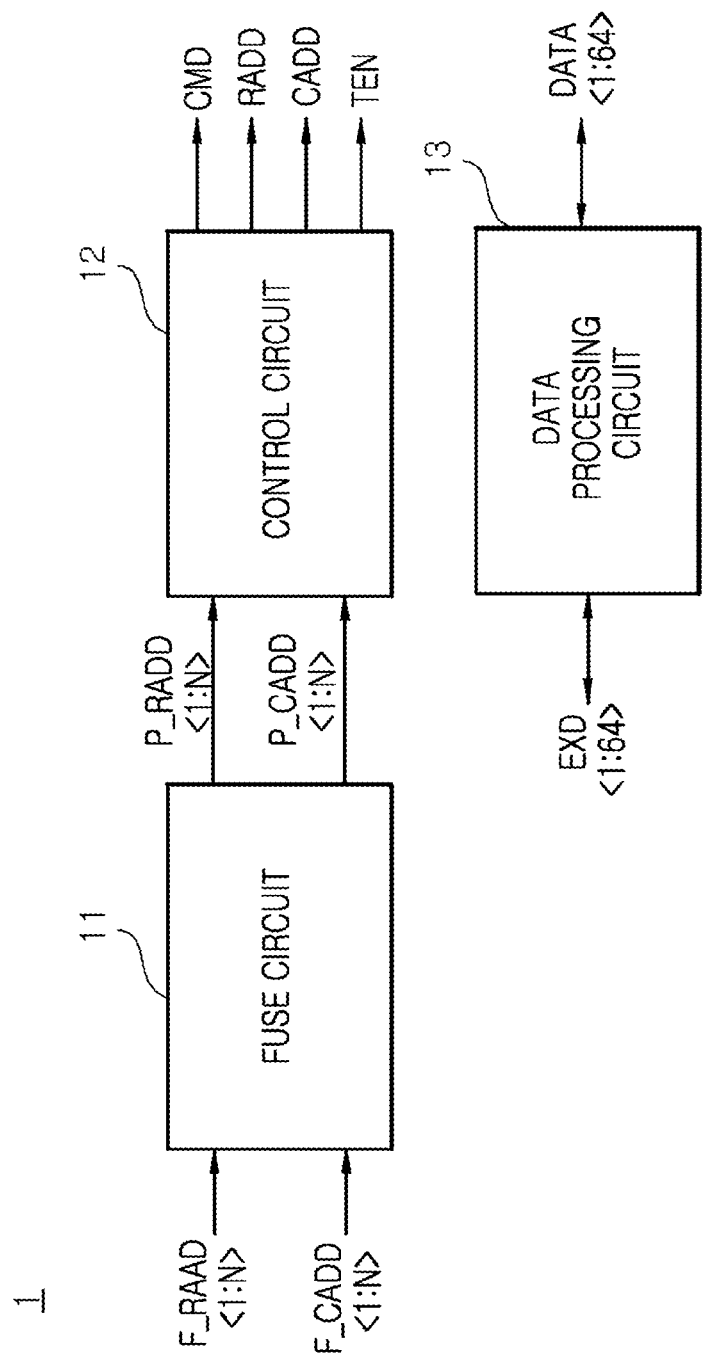
FIG. 2 is a block diagram illustrating a configuration of a first semiconductor device included in the semiconductor system of FIG. 1.

Referring to FIG. 2, the first semiconductor device 1 may include a fuse circuit 11, a control circuit 12, and a data processing circuit 13.

The fuse circuit 11 may include a plurality of fuses. The fuse circuit 11 may program the plurality of fuses to generate a programmed row address P_RADD<1:N> and a programmed column address P_CADD<1:N> according to the failure row address F_RADD<1:N> and the failure column address F_CADD<1:N>. The fuse circuit 11 may be realized using a general fuse array circuit in which a plurality of fuses are arrayed.

The control circuit 12 may output the command CMD, the row address RADD, the column address CADD, and the test enablement signal TEN. If an area selected by the row address RADD is identical to an area selected by the programmed row address P_RADD<1:N>, the control circuit 12 may change a combination of the row address RADD and may output the row address RADD having the changed combination. If an area selected by the column address CADD is identical to an area selected by the programmed column address P_CADD<1:N>, the control circuit 12 may change a combination of the column address CADD and may output the column address CADD having the changed combination. The control circuit 12 may interrupt the output of the command CMD, the row address RADD, and the column address CADD if the test enablement signal TEN is enabled.

The data processing circuit 13 may receive an external data EXD<1:64> to output the data DATA<1:64> during a write operation. The data processing circuit 13 may receive the data DATA<1:64> to output the external data EXD<1:64> during a read operation.

Figure 3:
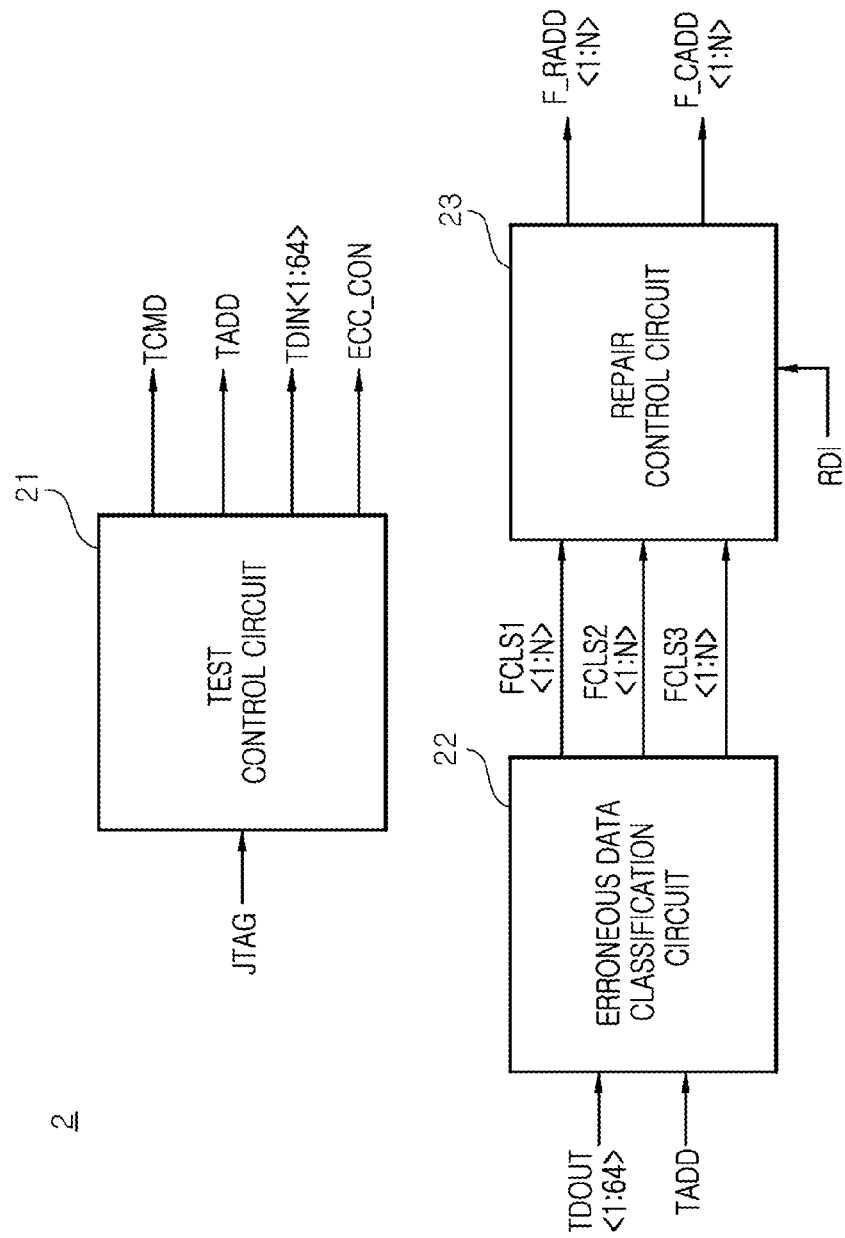
FIG. 3 is a block diagram illustrating a configuration of a second semiconductor device included in the semiconductor system of FIG. 1.

Referring to FIG. 3, the second semiconductor device 2 may include a test control circuit 21, an erroneous data classification circuit 22, and a repair control circuit 23.

The test control circuit 21 may output the test command TCMD, the test address TADD, the test input data TDIN<1:64>, and the error correction control signal ECC_CON in response to a test information signal JTAG provided by an external device. Although the test information signal JTAG is illustrated with a single signal line, the test information signal JTAG may be set to include a plurality of bits. The test information signal JTAG may include information for generating the test command TCMD, the test address TADD, the test input data TDIN<1:64>, and the error correction control signal ECC_CON. Although the test command TCMD is illustrated with a single signal line, the test command TCMD may be set to include a plurality of bits. Although the test address TADD is illustrated with a single signal line, the test address TADD may be set to include a plurality of bits. The number of bits of the test input data TDIN<1:64> may be set to be different according to the embodiments.

The erroneous data classification circuit 22 may classify the failure groups of the test output data TDOUT<1:64>. The erroneous data classification circuit 22 may generate first to third failure group information signals FCLS1<1:N>, FCLS2<1:N>, and FCLS3<1:N> from the test address TADD including position information on the failure groups of the test output data TDOUT<1:64>. The first failure group information signal FCLS1<1:N> may include the position information on the first failure group having a first priority. The second failure group information signal FCLS2<1:N> may include the position information on the second failure group having a second priority. The third failure group information signal FCLS3<1:N> may include the position information on the third failure group having a third priority.

The repair control circuit 23 may output the first to third failure group information signals FCLS1<1:N>, FCLS2<1:N>, and FCLS3<1:N> as the failure row address F_RADD<1:N> and the failure column address F_CADD<1:N> in response to a redundancy use information signal RDI. The redundancy use information signal RDI may include information on the availability of the redundancy area (the row redundancy area 352 and the column redundancy area 353 of FIG. 10). The redundancy use information signal RDI may be enabled if the redundancy area (the row redundancy area 352 and the column redundancy area 353 of FIG. 10) has a replaceable area.

Figure 4:
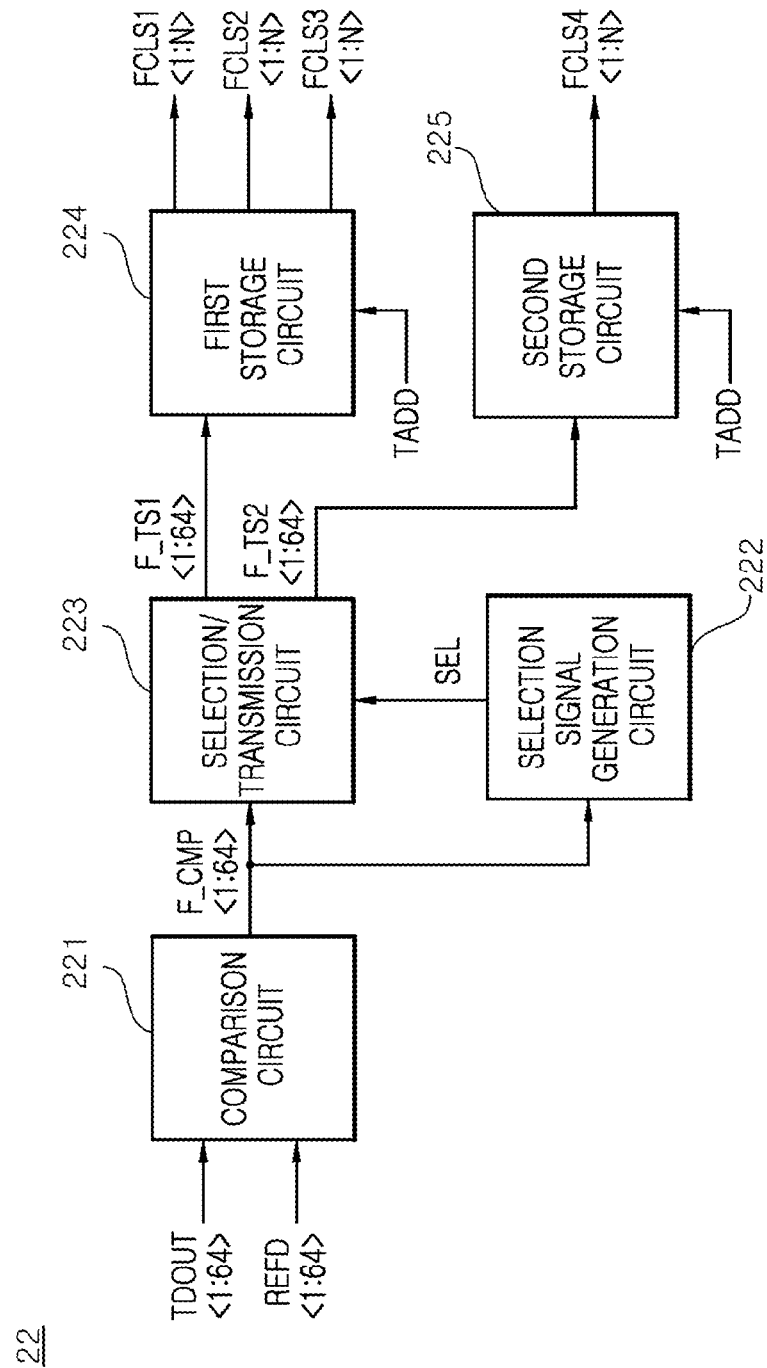
FIG. 4 is a block diagram illustrating a configuration of an erroneous data classification circuit included in the second semiconductor device of FIG. 3.

Referring to FIG. 4, the erroneous data classification circuit 22 may include a comparison circuit 221, a selection signal generation circuit 222, a selection and transmission (selection/transmission) circuit 223, a first storage circuit 224, and a second storage circuit 225.

The comparison circuit 221 may compare logic levels of the test output data TDOUT<1:64> with logic levels of reference data REFD<1:64> to generate a failure comparison signal F_CMP<1:64>. The comparison circuit 221 may compare logic levels of the corresponding bits of the test output data TDOUT<1:64> and the reference data REFD<1:64> to generate the failure comparison signal F_CMP<1:64>. For example, the comparison circuit 221 may generate the failure comparison signal F_CMP<1> which is enabled to have a logic "high" level if a logic level of the test output datum TDOUT<1> is different from a logic level of the reference datum REFD<1>. That is, the failure comparison signal F_CMP<1:64> may be generated to include information on the number of bit pairs having different logic levels among the pairs of the corresponding bits of the test output data TDOUT<1:64> and the reference data REFD<1:64>. The reference data REFD<1:64> may be set to have the same level combination as the test input data TDIN<1:64>.

The selection signal generation circuit 222 may generate a selection signal SEL in response to the failure comparison signal F_CMP<1:64>. The selection signal generation circuit 222 may generate the selection signal SEL which is enabled if any one bit of the failure comparison signal F_CMP<1:64> is enabled.

The selection/transmission circuit 223 may output the failure comparison signal F_CMP<1:64> as a first failure transmission signal F_TS1<1:64> or a second failure transmission signal F_TS2<1:64> in response to the selection signal SEL. The selection/transmission circuit 223 may output the failure comparison signal F_CMP<1:64> as the first failure transmission signal F_TS1<1:64> if the selection signal SEL is enabled. The selection/transmission circuit 223 may output the failure comparison signal F_CMP<1:64> as the second failure transmission signal F_TS2<1:64> if the selection signal SEL is disabled.

The first storage circuit 224 may detect the number of bits which are enabled among the bits of the first failure transmission signal F_TS1<1:64>. The first storage circuit 224 may synthesize the test address TADD and the first failure transmission signal F_TS1<1:64> to generate the first to third failure group information signals FCLS1<1:N>, FCLS2<1:N> and FCLS3<1:N> according to the detection result of the number of the bits which are enabled among the bits of the first failure transmission signal F_TS1<1:64>. The first failure group information signal FCLS1<1:N> may include position information of a memory area (351 of FIG. 10) storing the first failure group and position information of erroneous bits of the test output data TDOUT<1:64>. The second failure group information signal FCLS2<1:N> may include position information of the memory area (351 of FIG. 10) storing the second failure group and position information of erroneous bits of the test output data TDOUT<1:64>. The third failure group information signal FCLS3<1:N> may include position information of the memory area (351 of FIG. 10) storing the third failure group and position information of erroneous bits of the test output data TDOUT<1:64>.

The second storage circuit 225 may synthesize the test address TADD and the second failure transmission signal F_TS2<1:64> to generate a fourth failure group information signal FCLS4<1:N>. The fourth failure group information signal FCLS4<1:N> may include position information of the memory area (351 of FIG. 10) storing the fourth failure group and position information of erroneous bits of the test output data TDOUT<1:64>.

A method of setting the first to fourth failure groups of the test output data TDOUT<1:64> will be described hereinafter with reference to FIGS. 5 and 6.

Figure 5:
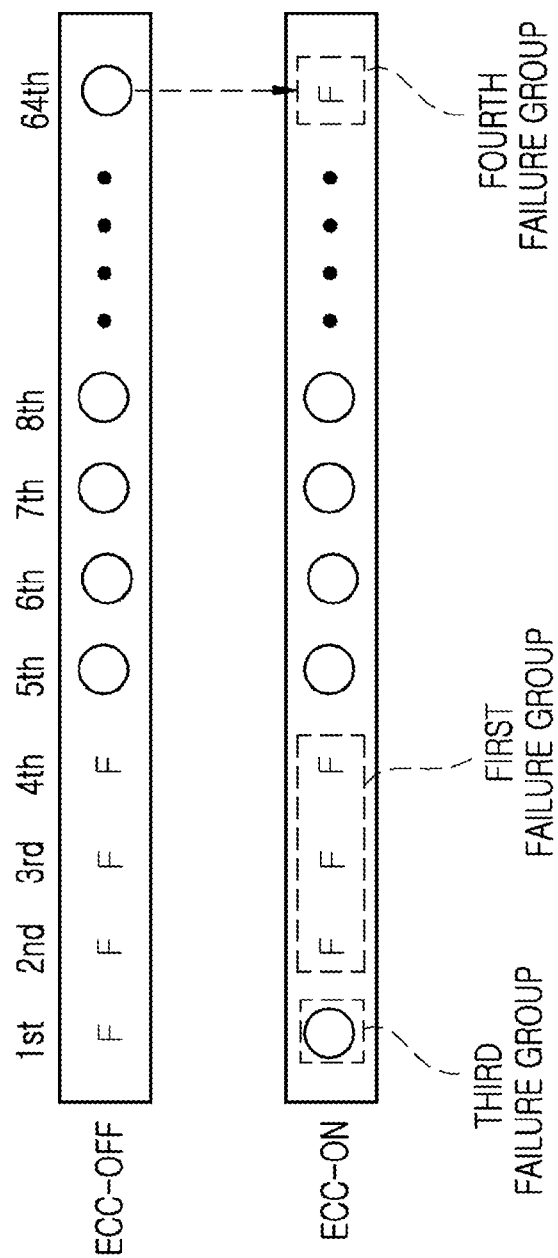
FIGS. 5 and 6 are schematic views illustrating first to fourth failure groups set in a semiconductor system according to an embodiment of the present disclosure.
Figure 6:
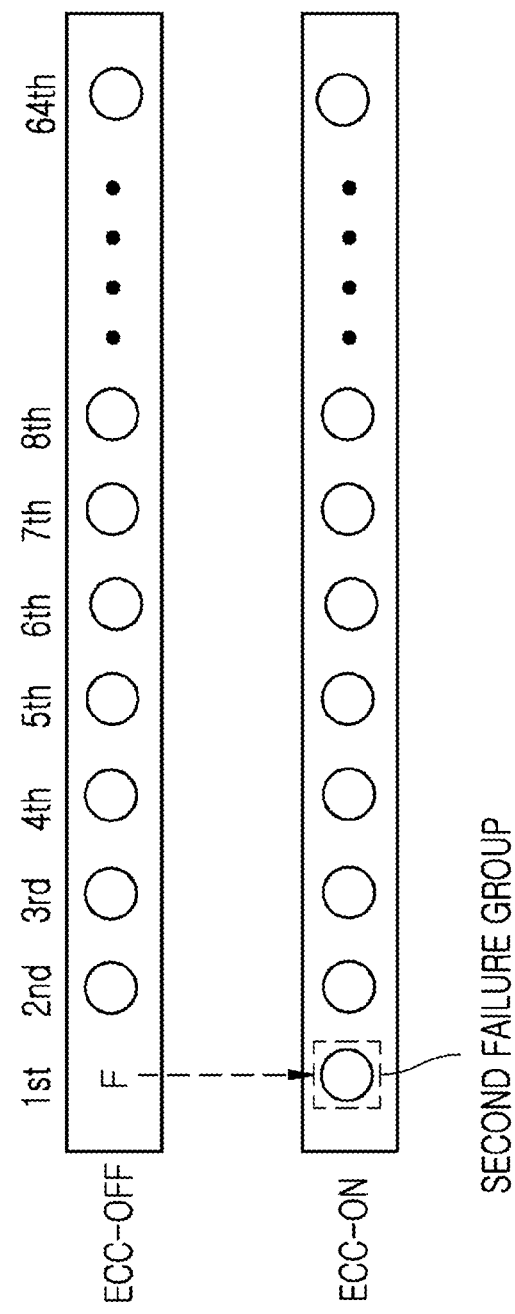

In FIGS. 5 and 6, "ECC_OFF" means the internal data (ID<1:64> of FIG. 8) before the error correction operation of the internal data (ID<1:64> of FIG. 8) is performed, and "ECC_ON" means the test output data TDOUT<1:64> generated after the error correction operation of the internal data (ID<1:64> of FIG. 8) is performed.

First, an example in which the first to fourth bits ID<1:4> of the internal data ID<1:64> have erroneous data (i.e., failed data "F") before the error correction operation will be described with reference to FIG. 5.

The first failure group of the test output data TDOUT<1:64> may be set to have failed bits which are not corrected by the error correction operation when the internal data ID<1:64> have at least two failed bits. That is, the first failure group of the test output data TDOUT<1:64> may be set to have the second, third, and fourth bits ID<2:4> of the internal data ID<1:64>.

The third failure group of the test output data TDOUT<1:64> may be set to have a single bit which is corrected by the error correction operation when the internal data ID<1:64> have at least two failed bits. That is, the third failure group of the test output data TDOUT<1:64> may be set to have the first bit ID<1> of the internal data ID<1:64>.

The fourth failure group of the test output data TDOUT<1:64> may be set to have a failed bit whose logic level is inverted by the error correction operation when the internal data ID<1:64> have at least two failed bits. That is, the fourth failure group of the test output data TDOUT<1:64> may be set to have the last bit, for example, the sixty fourth bit ID<64> of the internal data ID<1:64>.

Next, an example in which the first bit ID<1> of the internal data ID<1:64> has an erroneous datum (i.e., a failed datum "F") before the error correction operation will be described with reference to FIG. 6.

The second failure group of the test output data TDOUT<1:64> may be set to have a single bit which is corrected by the error correction operation when the internal data ID<1:64> have a single failed bit. Accordingly, the second failure group of the test output data TDOUT<1:64> may be set to have the first bit ID<1> of the internal data ID<1:64>.

Figure 7:
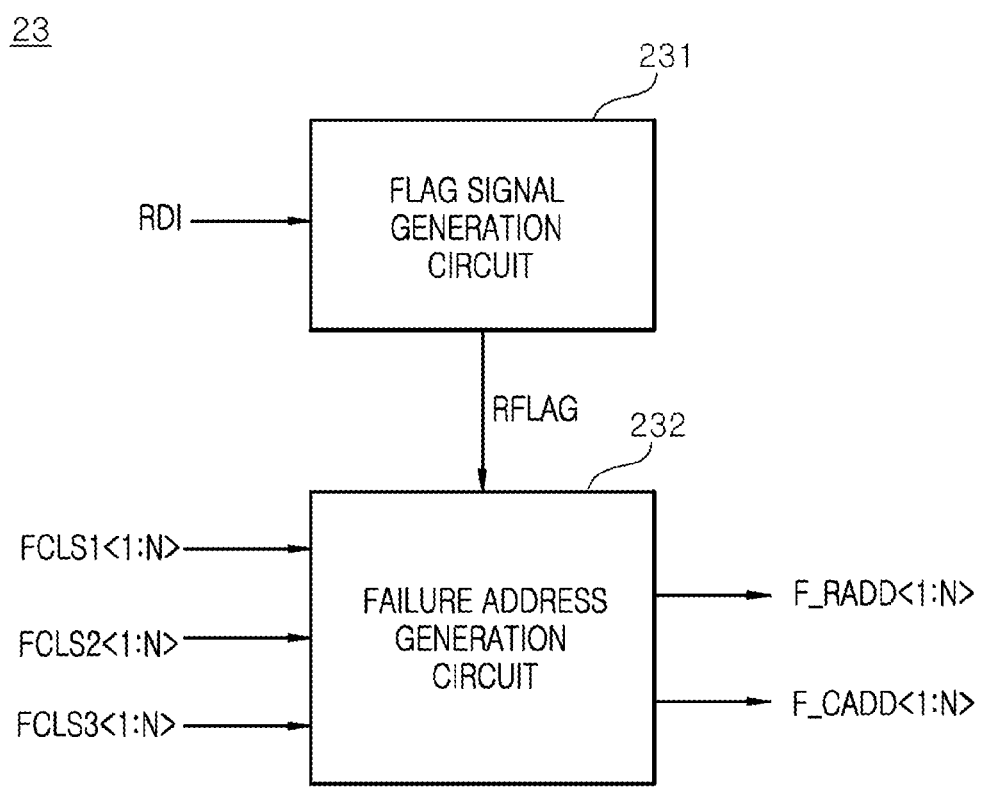
FIG. 7 is a block diagram illustrating a configuration of a repair control circuit included in the second semiconductor device of FIG. 3.

Referring to FIG. 7, the repair control circuit 23 may include a flag signal generation circuit 231 and a failure address generation circuit 232.

The flag signal generation circuit 231 may generate a flag signal RFLAG which is enabled in response to the redundancy use information signal RDI. The flag signal generation circuit 231 may generate the flag signal RFLAG which is enabled in response to the redundancy use information signal RDI if the redundancy area (the row redundancy area 352 and the column redundancy area 353 of FIG. 10) has a replaceable area.

The failure address generation circuit 232 may output the first to third failure group information signals FCLS1<1:N>, FCLS2<1:N>, and FCLS3<1:N> as the failure row address F_RADD<1:N> and the failure column address F_CADD<1:N> in response to the flag signal RFLAG. The failure address generation circuit 232 may generate the failure row address F_RADD<1:N> and the failure column address F_CADD<1:N> from the first failure group information signal FCLS1<1:N> if the flag signal RFLAG is enabled. The failure address generation circuit 232 may generate the failure row address F_RADD<1:N> and the failure column address F_CADD<1:N> from the second failure group information signal FCLS2<1:N> if the flag signal RFLAG is enabled. The failure address generation circuit 232 may generate the failure row address F_RADD<1:N> and the failure column address F_CADD<1:N> from the third failure group information signal FCLS3<1:N> if the flag signal RFLAG is enabled.

Figure 8:
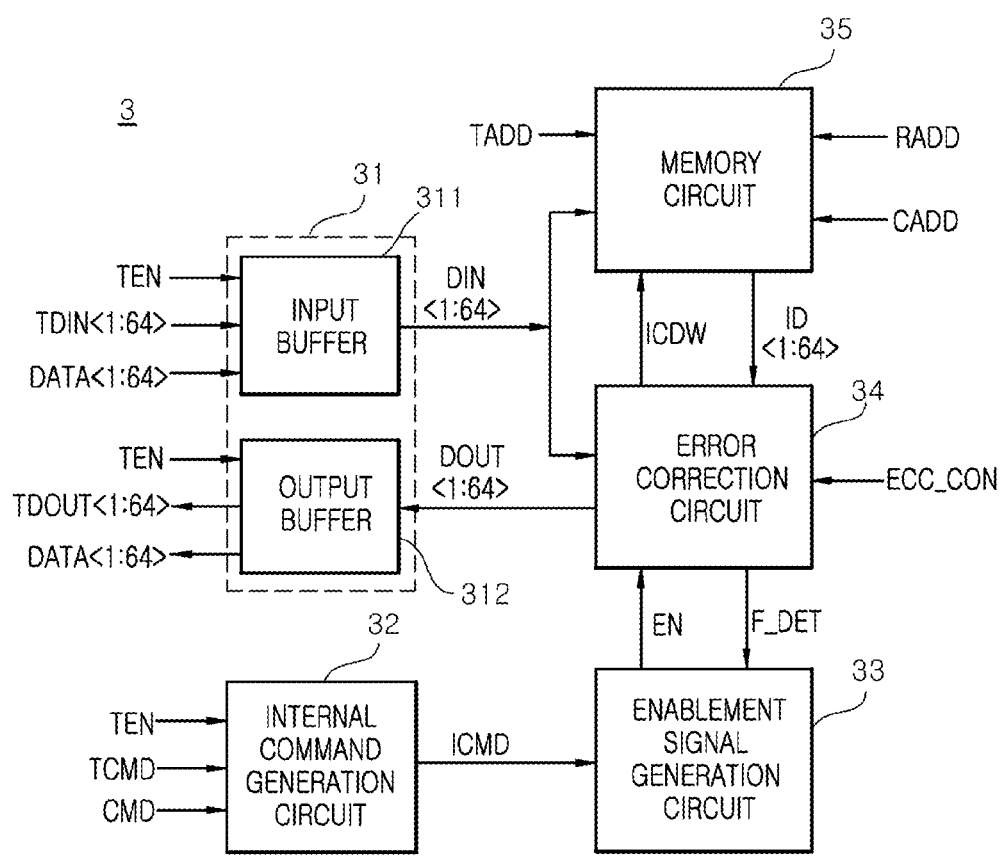
FIG. 8 is a block diagram illustrating a configuration of a third semiconductor device included in the semiconductor system of FIG. 1.

Referring to FIG. 8, the third semiconductor device 3 may include an input and output (input/output) (I/O) circuit 31, an internal command generation circuit 32, an enablement signal generation circuit 33, an error correction circuit 34, and a memory circuit 35.

The I/O circuit 31 may include an input buffer 311 and an output buffer 312.

The input buffer 311 may output the test input data TDIN<1:64> or the data DATA<1:64> as input data DIN<1:64> in response to the test enablement signal TEN. The input buffer 311 may output the test input data TDIN<1:64> as the input data DIN<1:64> if the test enablement signal TEN is enabled. The input buffer 311 may drive the input data DIN<1:64> in response to the test input data TDIN<1:64> if the test enablement signal TEN is enabled. The input buffer 311 may output the data DATA<1:64> as the input data DIN<1:64> if the test enablement signal TEN is disabled. The input buffer 311 may drive the input data DIN<1:64> in response to the data DATA<1:64> if the test enablement signal TEN is disabled.

The output buffer 312 may transmit output data DOUT<1:64> as the test output data TDOUT<1:64> or the data DATA<1:64> in response to the test enablement signal TEN. The output buffer 312 may output the output data DOUT<1:64> as the test output data TDOUT<1:64> if the test enablement signal TEN is enabled. The output buffer 312 may drive the test output data TDOUT<1:64> in response to the output data DOUT<1:64> if the test enablement signal TEN is enabled. The output buffer 312 may output the output data DOUT<1:64> as the data DATA<1:64> if the test enablement signal TEN is disabled. The output buffer 312 may drive the data DATA<1:64> in response to the output data DOUT<1:64> if the test enablement signal TEN is disabled.

The internal command generation circuit 32 may decode the test command TCMD or the command CMD to generate an internal command ICMD, in response to the test enablement signal TEN. The internal command generation circuit 32 may decode the test command TCMD to generate the internal command ICMD if the test enablement signal TEN is enabled. The internal command generation circuit 32 may decode the command CMD to generate the internal command ICMD if the test enablement signal TEN is disabled. The internal command ICMD may be a command for controlling an internal operation (e.g., a write operation or a read operation) of the third semiconductor device 3.

The enablement signal generation circuit 33 may generate an enablement signal EN which is enabled in response to the internal command ICMD if a failure detection signal F_DET is enabled. The enablement signal generation circuit 33 may generate the enablement signal EN which is disabled in response to the internal command ICMD if the failure detection signal F_DET is disabled.

The error correction circuit 34 may generate an internal codeword ICDW including error information on the input data DIN<1:64>, may detect erroneous data of the internal data ID<1:64> to generate the failure detection signal F_DET, and may perform the error correction operation of the internal data ID<1:64> to generate the output data DOUT<1:64> according to the error correction control signal ECC_CON. The error correction circuit 34 may generate the internal codeword ICDW including error information on the input data DIN<1:64> during the write operation. The error correction circuit 34 may detect erroneous data of the internal data ID<1:64> to generate the failure detection signal F_DET during the read operation. The error correction circuit 34 may perform the error correction operation of the internal data ID<1:64> to generate the output data DOUT<1:64> during the read operation.

The memory circuit 35 may store the input data DIN<1:64> as the internal data ID<1:64> according to the test address TADD or the row and column addresses RADD and CADD during the write operation. The memory circuit 35 may store the input data DIN<1:64> corresponding to the internal data ID<1:64> into the memory area (351 of FIG. 10) thereof according to the test address TADD which is sequentially counted, during a write operation for test. The memory circuit 35 may store the internal codeword ICDW during the write operation for test. The memory circuit 35 may store the input data DIN<1:64> as the internal data ID<1:64> according to the row and column addresses RADD and CADD during a normal write operation. The memory circuit 35 may store the internal codeword ICDW during the normal write operation. The memory circuit 35 may output the internal data ID<1:64> stored therein according to the test address TADD or the row and column addresses RADD and CADD during the read operation. The memory circuit 35 may output the internal data ID<1:64> stored in the memory area (351 of FIG. 10) according to the test address TADD which is sequentially counted during a read operation for test. The memory circuit 35 may output the internal data ID<1:64> stored in the memory area (351 of FIG. 10) according to the row and column addresses RADD and CADD during a normal read operation. The memory circuit 35 may be realized to include both of an area for storing the input data DIN<1:64> and an area for storing the internal codeword ICDW.

Figure 9:
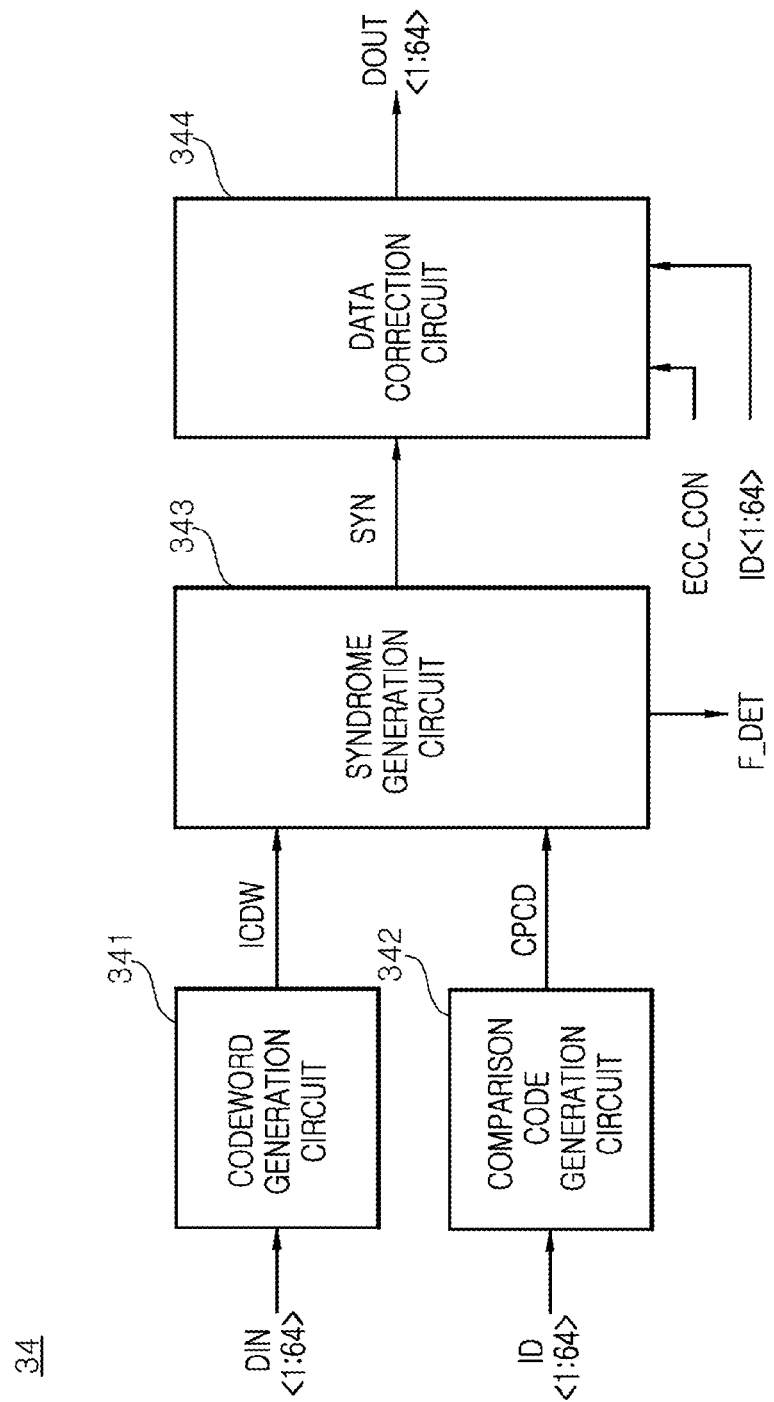
FIG. 9 is a block diagram illustrating a configuration of an error correction circuit included in the third semiconductor of FIG. 8.

Referring to FIG. 9, the error correction circuit 34 may include a codeword generation circuit 341, a comparison code generation circuit 342, a syndrome generation circuit 343, and a data correction circuit 344.

The codeword generation circuit 341 may generate the internal codeword ICDW including error information on the input data DIN<1:64>. The codeword generation circuit 341 may generate the internal codeword ICDW including error information on the input data DIN<1:64> during the write operation.

The comparison code generation circuit 342 may generate a comparison code CPCD including error information on the internal data ID<1:64>. The comparison code generation circuit 342 may generate the comparison code CPCD including error information on the internal data ID<1:64> during the read operation.

The syndrome generation circuit 343 may compare the internal codeword ICDW with the comparison code CPCD to generate a syndrome signal SYN and may generate the failure detection signal F_DET which is enabled if the syndrome signal SYN is generated. The syndrome generation circuit 343 may compare the internal codeword ICDW with the comparison code CPCD to generate the syndrome signal SYN during the read operation and may generate the failure detection signal F_DET which is enabled if the syndrome signal SYN is generated. The syndrome signal SYN may include position information of erroneous bits (i.e., failed bits) among the bits included in the internal data ID<1:64>.

The data correction circuit 344 may correct erroneous data of the internal data ID<1:64> to output the corrected internal data as the output data DOUT<1:64> according to the syndrome signal SYN, in response to the error correction control signal ECC_CON. The data correction circuit 344 may correct erroneous data of the internal data ID<1:64> to output the corrected internal data as the output data DOUT<1:64> according to the syndrome signal SYN, in response to the error correction control signal ECC_CON during the read operation. The data correction circuit 344 may correct erroneous data of the internal data ID<1:64> to output the corrected internal data as the output data DOUT<1:64> according to the syndrome signal SYN, if the error correction control signal ECC_CON is enabled during the read operation. The data correction circuit 344 may output the internal data ID<1:64> as the output data DOUT<1:64> without correcting erroneous data of the internal data ID<1:64>, in response to the error correction control signal ECC_CON. The data correction circuit 344 may output the internal data ID<1:64> as the output data DOUT<1:64> without correcting erroneous data of the internal data ID<1:64>, in response to the error correction control signal ECC_CON during the read operation. The data correction circuit 344 may output the internal data ID<1:64> as the output data DOUT<1:64> without correcting erroneous data of the internal data ID<1:64>, if the error correction control signal ECC_CON is disabled during the read operation.

The error correction circuit 34 described above may include in part a general error correction code (ECC) circuit using an error detection code (EDC) and an error correction code (ECC).

Figure 10:
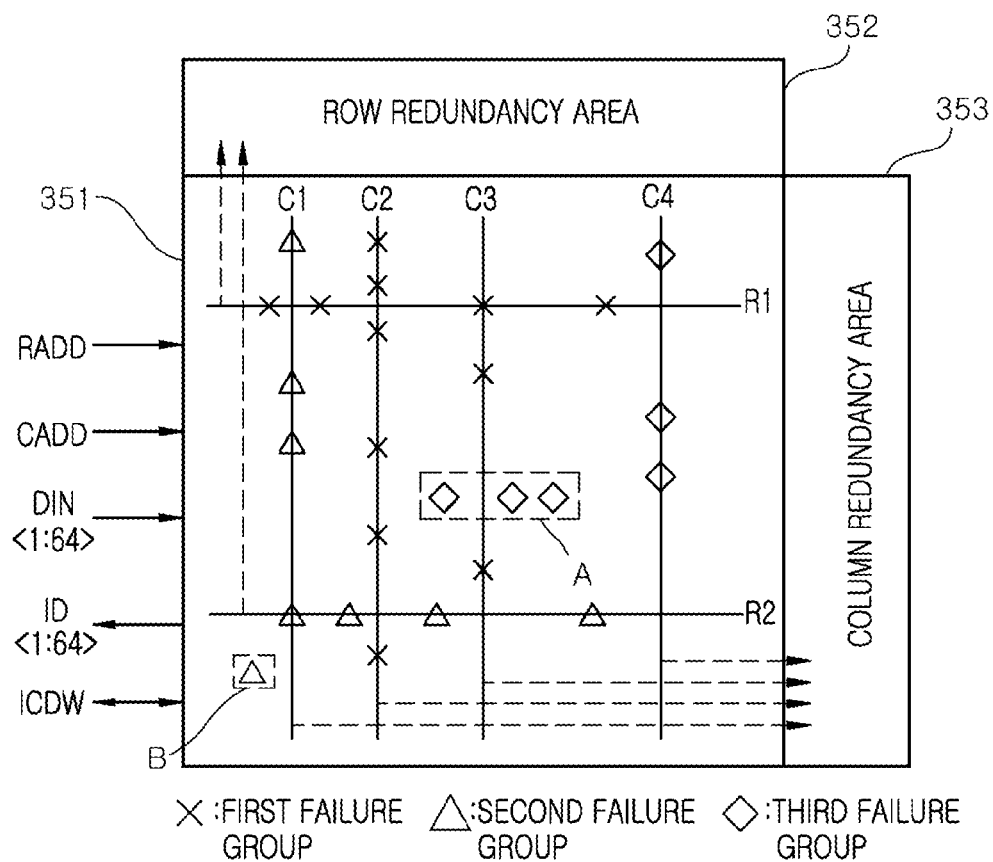
FIG. 10 is a block diagram illustrating a configuration of a memory circuit included in the third semiconductor of FIG. 8.

Referring to FIG. 10, the memory circuit 35 may include the memory area 351, the row redundancy area 352, and the column redundancy area 353.

The memory area 351 may store the input data DIN<1:64> into an area selected by the test address TADD sequentially counted and may output the stored input data DIN<1:64> as the internal data ID<1:64>. The memory area 351 may store the input data DIN<1:64> into an area selected by the row and column addresses RADD and CADD and may output the stored input data DIN<1:64> as the internal data ID<1:64>. The memory area 351 may store the input data DIN<1:64> into an area selected by the test address TADD during the write operation for test. The memory area 351 may store the internal codeword ICDW during the write operation for test. The memory area 351 may output the input data DIN<1:64> stored in an area selected by the test address TADD as the internal data ID<1:64> during the read operation for test. The memory area 351 may store the input data DIN<1:64> into an area selected by the row and column addresses RADD and CADD during the normal write operation. The memory area 351 may store the internal codeword ICDW during the normal write operation. The memory area 351 may output the input data DIN<1:64> stored in an area selected by the row and column addresses RADD and CADD as the internal data ID<1:64> during the normal read operation.

The row redundancy area 352 may replace the memory area 351 having the failure group according to the row address RADD to store the input data DIN<1:64> into the row redundancy area 352 and may output the stored input data DIN<1:64> as the internal data ID<1:64>. The row redundancy area 352 may replace the memory area 351 having the failure group according to the row address RADD to store the input data DIN<1:64> into the row redundancy area 352 during the write operation. The row redundancy area 352 may output the stored input data DIN<1:64> as the internal data ID<1:64> according to the row address RADD during the read operation.

The column redundancy area 353 may replace the memory area 351 having the failure group according to the column address CADD to store the input data DIN<1:64> into the column redundancy area 353 and may output the stored input data DIN<1:64> as the internal data ID<1:64>. The column redundancy area 353 may replace the memory area 351 having the failure group according to the column address CADD to store the input data DIN<1:64> into the column redundancy area 353 during the write operation. The column redundancy area 353 may output the stored input data DIN<1:64> as the internal data ID<1:64> according to the column address CADD during the read operation.

An operation of replacing the memory area 351 in which the first to third failure groups of the test output data TDOUT<1:64> are stored with the row redundancy area 352 and the column redundancy area 353 will be described hereinafter with reference to FIG. 10.

If a row address RADD<1:N> for selecting a first row area R1 including first failure groups (indicated by a symbol "X") is inputted to the memory circuit 35, the first row area R1 of the memory area 351 may be replaced with the row redundancy area 352 to store the input data DIN<1:64> into the row redundancy area 352 and the input data DIN<1:64> stored in the row redundancy area 352 may be outputted as the internal data ID<1:64>.

If the row address RADD<1:N> for selecting a second row area R2 including second failure groups (indicated by a symbol "Δ") is inputted to the memory circuit 35, the second row area R2 of the memory area 351 may be replaced with the row redundancy area 352 to store the input data DIN<1:64> into the row redundancy area 352 and the input data DIN<1:64> stored in the row redundancy area 352 may be outputted as the internal data ID<1:64>.

If a column address CADD<1:N> for selecting a first column area C1 including the second failure groups (indicated by the symbol "Δ") is inputted to the memory circuit 35, the first column area C1 of the memory area 351 may be replaced with the column redundancy area 353 to store the input data DIN<1:64> into the column redundancy area 353 and the input data DIN<1:64> stored in the column redundancy area 353 may be outputted as the internal data ID<1:64>.

If the column address CADD<1:N> for selecting a second column area C2 and a third column area C3 including the first failure groups (indicated by the symbol "X") is inputted to the memory circuit 35, the second and third column areas C2 and C3 may be replaced with the column redundancy area 353 to store the input data DIN<1:64> into the column redundancy area 353 and the input data DIN<1:64> stored in the column redundancy area 353 may be outputted as the internal data ID<1:64>.

If the column address CADD<1:N> for selecting a fourth column area C4 including third failure groups (indicated by a symbol "◊") is inputted to the memory circuit 35, the fourth column area C4 may be replaced with the column redundancy area 353 to store the input data DIN<1:64> into the column redundancy area 353 and the input data DIN<1:64> stored in the column redundancy area 353 may be outputted as the internal data ID<1:64>.

The memory area 351 in which the first failure groups (indicated by the symbol "X") are stored may be replaced with the row redundancy area 352 and the column redundancy area 353 by the first priority, the memory area 351 in which the second failure groups (indicated by the symbol "Δ") are stored may be replaced with the row redundancy area 352 and the column redundancy area 353 by the second priority, and the memory area 351 in which the third failure groups (indicated by the symbol "◊") are stored may be replaced with the row redundancy area 352 and the column redundancy area 353 by the third priority.

If entire portions of the row redundancy area 352 and the column redundancy area 353 are used to replace defective portions (i.e., the failure groups) of the memory area 351 so that no replaceable redundancy area remains in the row redundancy area 352 and the column redundancy area 353, an area "A" including the third failure groups (indicated by the symbol "◊") may not be replaced with any of the row redundancy area 352 and the column redundancy area 353. In addition, if entire portions of the row redundancy area 352 and the column redundancy area 353 are used to replace defective portions (i.e., the failure groups) of the memory area 351 so that no replaceable redundancy area remains in the row redundancy area 352 and the column redundancy area 353, an area "B" including the second failure group (indicated by the symbol "Δ") may not be replaced with any of the row redundancy area 352 and the column redundancy area 353.

As described above, a semiconductor system according to an embodiment may classify failure groups of data including erroneous bits and may replace a memory area in which the failure groups are stored with a redundancy area according to priorities of the failure groups. As a result, the fabrication yield of the semiconductor systems may be improved.

Figure 11:
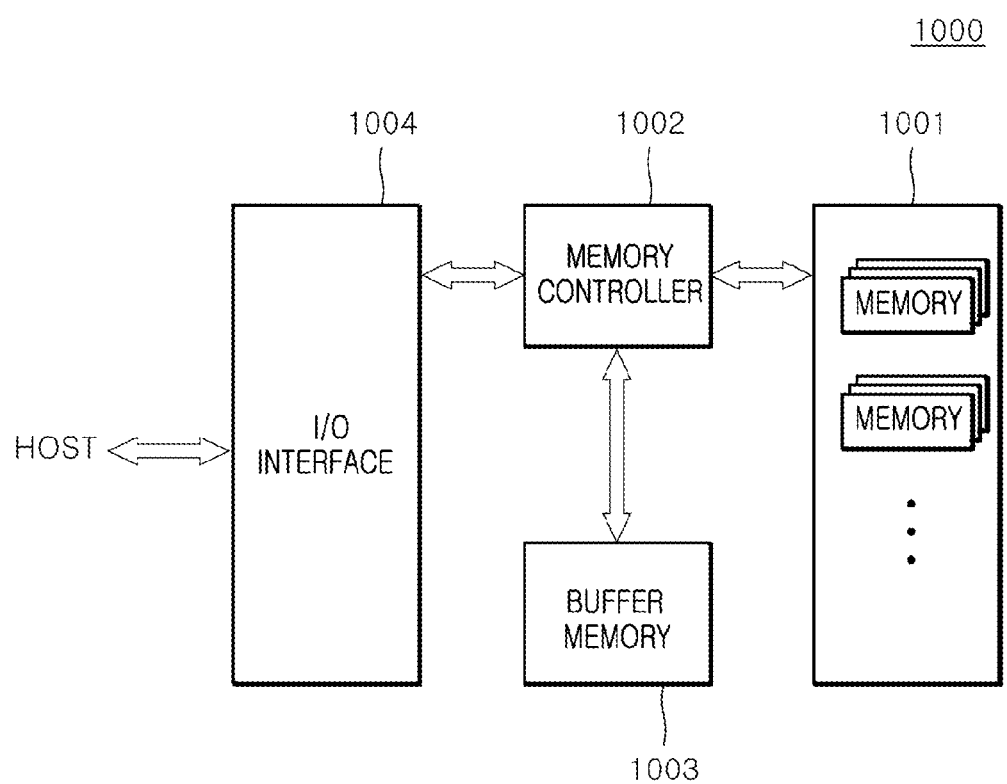
FIG. 11 is a block diagram illustrating a configuration of an electronic system employing the semiconductor system described with reference to FIGS. 1 to 10.

The semiconductor devices or the semiconductor system described with reference to FIGS. 1 to 10 may be applied to an electronic system that includes a memory system, a graphic system, a computing system, a mobile system, or the like. For example, as illustrated in FIG. 11, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the third semiconductor device 3 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first and second semiconductor devices 1 and 2 illustrated in FIG. 1. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB) drive, a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB drive, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 12:
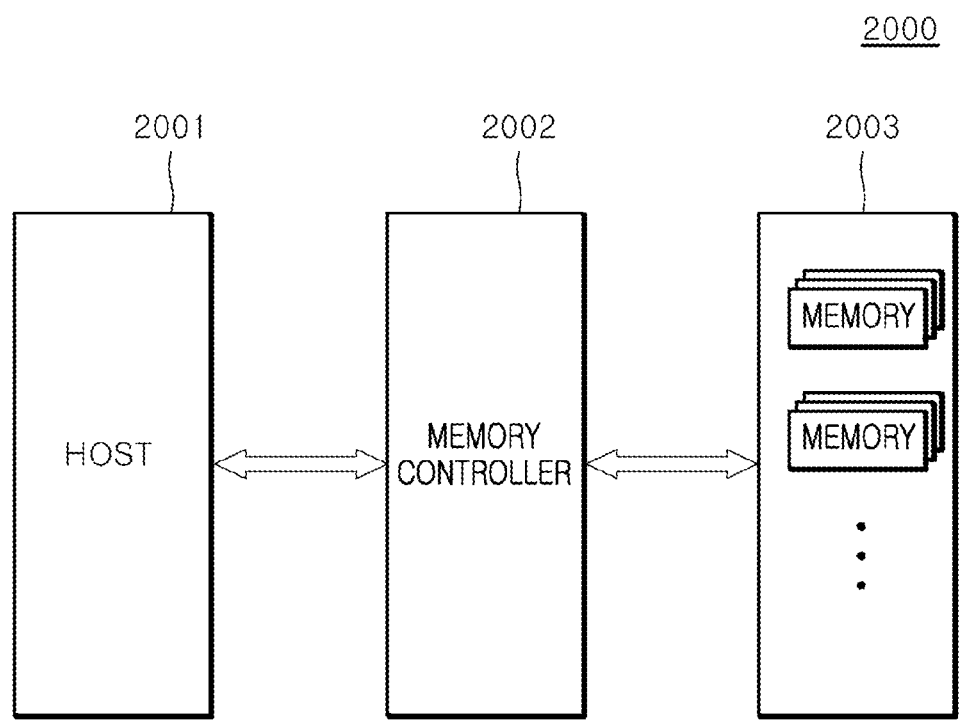
FIG. 12 is a block diagram illustrating a configuration of an electronic system employing the semiconductor system described with reference to FIGS. 1 to 10.

Referring to FIG. 12, an electronic system 2000 according an embodiment may include a host 2001, a memory controller 2002, and a data storage circuit 2003.

The host 2001 may output a request signal and data to the memory controller 2002 to access to the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001. The memory controller 2002 may include the first and second semiconductor devices 1 and 2 illustrated in FIG. 1.

The data storage circuit 2003 may include a plurality of memories. The data storage circuit 2003 may receive the data, the data strobe signal, the command, the addresses, and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the third semiconductor device 3 illustrated in FIG. 1.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor system comprising:
   a first semiconductor device, including at least a control circuit, configured to output a test address and an error correction control signal, and configured to set priorities of failure groups of test output data; and
   a second semiconductor device, including at least a test control circuit, configured to perform an error correction operation of internal data selected by the test address to output the corrected internal data as the test output data based on a test enablement signal and the error correction control signal and configured to replace a memory area in which the failure groups of the test output data are stored with a redundancy area according to the priorities of the failure groups,
   wherein the failure groups include first to fourth failure groups, and
   wherein the second semiconductor device sequentially replaces the first to third failure groups with the redundancy area.

2. The semiconductor system of claim 1, wherein the second semiconductor device does not replace the fourth failure group with the redundancy area.

3. The semiconductor system of claim 1, wherein the second semiconductor device replaces the memory area in which the failure groups of the test output data are stored with the redundancy area if a replaceable area remains in the redundancy area.

4. The semiconductor system of claim 1,
   wherein the first semiconductor device is configured to output test input data, and
   wherein each of the failure groups of the test output data generated after the error correction operation includes a bit having a logic level which is different from a logic level of the corresponding bit of the test input data.

5. The semiconductor system of claim 1, wherein the first semiconductor device includes:
   the test control circuit configured to output a test command, the test address, test input data, and the error correction control signal according to a test information signal;
   an erroneous data classification circuit configured to classify the failure groups of the test output data and configured to generate first to fourth failure group information signals from the test address including position information on the failure groups; and
   a repair control circuit configured to output the first to third failure group information signals as the failure row address and the failure column address based on a redundancy use information signal.

6. The semiconductor system of claim 5, wherein the erroneous data classification circuit includes:
   a comparison circuit configured to compare logic levels of the test output data with logic levels of reference data to generate a failure comparison signal;
   a selection signal generation circuit configured to generate a selection signal which is enabled if only one bit of the failure comparison signal is enabled;
   a selection and transmission (selection/transmission) circuit configured to output the failure comparison signal as a first failure transmission signal or a second failure transmission signal based on the selection signal;
   a first storage circuit configured to synthesize the test address and the first failure transmission signal to generate the first to third failure group information signals according to the number of bits which are enabled among bits of the first failure transmission signal; and
   a second storage circuit configured to synthesize the test address and the second failure transmission signal to generate the fourth failure group information signal.

7. The semiconductor system of claim 6,
   wherein the first failure group information signal is set to have a first priority;
   wherein the second failure group information signal is set to have a second priority; and
   wherein the third failure group information signal is set to have a third priority.

8. The semiconductor system of claim 5, wherein the repair control circuit includes:
   a flag signal generation circuit configured to generate a flag signal which is enabled based on the redundancy use information signal if a replaceable area remains in the redundancy area; and
   a failure address generation circuit configured to output the first to third failure group information signals as the failure row address and the failure column address based on the flag signal.

9. The semiconductor system of claim 1,
   Wherein the first semiconductor device is configured to output a test command and test input data, and
   wherein the second semiconductor device includes:
   an input and output (input/output) (I/O) circuit configured to output the test input data or data as input data in response to the test enablement signal and configured to transmit output data as the test output data or the data based on the test enablement signal;

an internal command generation circuit configured to decode the test command or a command to generate an internal command based on the test enablement signal;

an enablement signal generation circuit configured to generate an enablement signal which is enabled based on the internal command if a failure detection signal is enabled;

an error correction circuit configured to generate an internal codeword including error information on the input data, configured to detect erroneous data of the internal data to generate the failure detection signal, and configured to perform the error correction operation of the internal data to generate the output data; and a memory circuit configured to store the input data as the internal data based on the test address or an address, configured to output the stored internal data based on the test address or the address, or configured to store the internal codeword based on the test address or the address.

10. The semiconductor system of claim 9, wherein the error correction circuit includes:

a codeword generation circuit configured to generate the internal codeword including error information on the input data;

a comparison code generation circuit configured to generate a comparison code including error information on the internal data;

a syndrome generation circuit configured to compare the internal codeword with the comparison code to generate a syndrome signal and configured to generate the failure detection signal which is enabled if the syndrome signal is generated; and a data correction circuit configured to correct erroneous data of the internal data to output the corrected internal data as the output data according to the syndrome signal based on the error correction control signal or configured to output the internal data as the output data without correcting the internal data based on the error correction control signal.

11. The semiconductor system of claim 10, wherein the syndrome signal includes position information of erroneous bits among bits included in the internal data.

12. The semiconductor system of claim 9, wherein the memory circuit includes:

a memory area configured to store the input data into an area selected by the row address and the column address and configured to output the stored input data as the internal data;

a row redundancy area configured to replace the memory area having any one of the failure groups according to the row address to store the input data into the row redundancy area and configured to output the stored input data as the internal data; and a column redundancy area configured to replace the memory area having any one of the failure groups according to the column address to store the input data into the column redundancy area and configured to output the stored input data as the internal data.

* * * * *